United States Patent
Hsu et al.

(10) Patent No.: US 6,849,564 B2
(45) Date of Patent: Feb. 1, 2005

(54) 1R1D R-RAM ARRAY WITH FLOATING P-WELL

(75) Inventors: Sheng Teng Hsu, Camas, WA (US); Wei Pan, Vancouver, WA (US); Wei-Wei Zhuang, Vancouver, WA (US); Fengyan Zhang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/376,796

(22) Filed: Feb. 27, 2003

(65) Prior Publication Data

US 2004/0171215 A1 Sep. 2, 2004

(30) Foreign Application Priority Data

Mar. 7, 2002 (DE) .......................................... 102 10 180

(51) Int. Cl.[7] .............................................. H01L 21/00
(52) U.S. Cl. ........................................ 438/800; 365/148
(58) Field of Search ................................ 438/132, 638, 438/800, 979, 983; 257/104–106, 529–530, 776; 365/148, 174–175

(56) References Cited

U.S. PATENT DOCUMENTS 5,818,749 A * 10/1998 Harshfield ................... 365/105
6,483,368 B2 * 11/2002 Mayer et al. ................ 327/365

* cited by examiner

*Primary Examiner*—David Nelms
*Assistant Examiner*—David Vu
(74) *Attorney, Agent, or Firm*—David C. Ripma; Matthew D. Rabdau; Joseph P. Curtin

(57) ABSTRACT

A low-capacitance one-resistor/one-diode (1R1D) R-RAM array with a floating p-well is provided. The fabrication method comprises: forming an integrated circuit (IC) substrate; forming an n-doped buried layer (buried n layer) of silicon overlying the substrate; forming n-doped silicon sidewalls overlying the buried n layer; forming a p-doped well of silicon (p-well) overlying the buried n layer; and, forming a 1R1D R-RAM array overlying the p-well. Typically, the combination of the buried n layer and the n-doped sidewalls form an n-doped well (n-well) of silicon. Then, the p-well is formed inside the n-well. In other aspects, the p-well has sidewalls, and the method further comprises: forming an oxide insulator overlying the p-well sidewalls, between the n-well and the R-RAM array.

26 Claims, 3 Drawing Sheets

FLOATING P-WELL TRENCH ISOLATED 1R1D RRAM

1R1D R-RAM ARRAY WITH FLOATING P-WELL

BACKGROUND OF THE INVENTION

1. Field of the Invention

This invention generally relates to integrated circuit (IC) memory fabrication and, more particularly, a high-density, high-speed crosspoint resistor memory array, applicable to ultra large-scale integrated (ULSI) memory chips and embedded memory applications, that uses a floating p-well.

2. Description of the Related Art

Electrically programmable resistance non-volatile memory devices have been demonstrated at room temperature conditions, although not in a functional array. High-density memories such as dynamic random access memory (DRAM) and Flash memory currently exist, having a small cell size, suggesting that the high-density integration of electrically programmable resistance non-volatile memory devices is also possible. However, DRAM fabrication is relatively complex. Flash memory is complex to operate, requiring high voltage programming. Further, there have been difficulties in scaling Flash memory down to a sub-micron cell size.

Conventionally, high-density crosspoint resistor RAM (R-RAM) memory has used an n+ silicon layer as either a bit line or word line. The R-RAM memory resistor is connected to the n+ layer through a p+ diffusion layer. The n+ bit (or word line) is fabricated onto the p-well. The junction capacitance between the n+ layer and the p-well is parasitic, providing a current leakage path for incoming signals. As a result, the high frequency operation of the array is degraded, or the bit (or the word) n+ line lengths must be kept relatively short.

FIG. 1 is a partial cross-sectional view of a trench isolated crosspoint R-RAM array (prior art). The top electrode (TE) is shown as word line, while the n+ layer is shown as a bit line. Alternately but not shown, the top electrode could a bit line and the n+ layer could be a word line. The contact to the n+ line, as shown, is the same metal that is used for the top electrode. Alternately, the contact can be any circuit interconnect metal. The n+ line is a distributed resistor/capacitor (RC) transmission line at high frequencies. The junction capacitance is the parasitic capacitance. A high-speed R-RAM operates with programming and the read pulse width of 10 nanoseconds, corresponding to a frequency of 100 megahertz (MHz). At this frequency, the parasitic capacitance at the n+ layer may significantly degrade the operating pulses, especially if the n+ layer bit line has a long length.

It would be advantageous if an R-RAM array could be fabricated with extremely small cell sizes, using relatively simple fabrication processes.

It would be advantageous if the capacitance of n+ layer bit or word lines in an R-RAM could be minimized, permitting the R-RAM to be fabricated with longer n+ layer line lengths, and operated at higher frequencies.

It would be advantageous if arrays with longer length n+ layer bit (word) lines could be fabricated, so that the number of cells in an R-RAM array could be increased.

SUMMARY OF THE INVENTION

The present invention provides a means for reducing the capacitance of a silicon n+ layer bit/word line. As noted above, reducing the n+ line capacitance permits larger and faster arrays to be fabricated.

Accordingly, a method is provided for fabricating a one-resistor/one-diode (1R1D) R-RAM array with a floating p-well. The method comprises: forming an integrated circuit (IC) substrate; forming an n-doped buried layer (buried n layer) of silicon overlying the substrate; forming n-doped silicon sidewalls overlying the buried n layer; forming a p-doped well of silicon (p-well) overlying the buried n layer; and, forming a 1R1D R-RAM array overlying the p-well.

In some aspects of the method, the combination of the buried n layer and the n-doped sidewalls forms an n-doped well (n-well) of silicon. Then, the p-well is formed inside the n-well. In other aspects, the p-well has walls, and the method further comprises: forming an oxide insulator overlying the p-well walls, between the n-well and the R-RAM array.

In some aspects, forming a 1R1D R-RAM array overlying the p-well includes: forming a bit lines overlying the p-well top surface; forming b word lines overlying and orthogonal to the bit lines; and, forming (b×a) one resistor/one diode (1R1D) elements interposed between each bit line and each overlying word line.

In other aspects, forming (b×a) one resistor/one diode (1R1D) elements interposed between each bit line and each overlying word line includes: forming b oxide insulated word line trenches overlying and orthogonal to the bit lines; in each trench forming a layer of p-doped silicon overlying the bit lines; forming a layer of bottom electrode overlying the p-doped layer; and, forming a layer of memory resistor material overlying the bottom electrode. Then, forming b word lines overlying and orthogonal to the bit lines includes forming the word lines overlying the memory resistor layers.

Additional details of the above-described method and a one-resistor/one-diode (1R1D) R-RAM with a floating p-well are provided below.

DETAILED DESCRIPTION OF THE PREFERRED EMBODIMENTS

Figure 1:
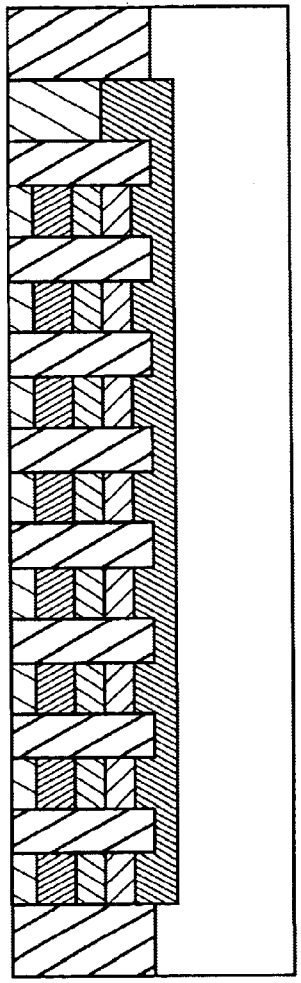
FIG. 1 is a partial cross-sectional view of a trench isolated crosspoint R-RAM array (prior art).
Figure 2:
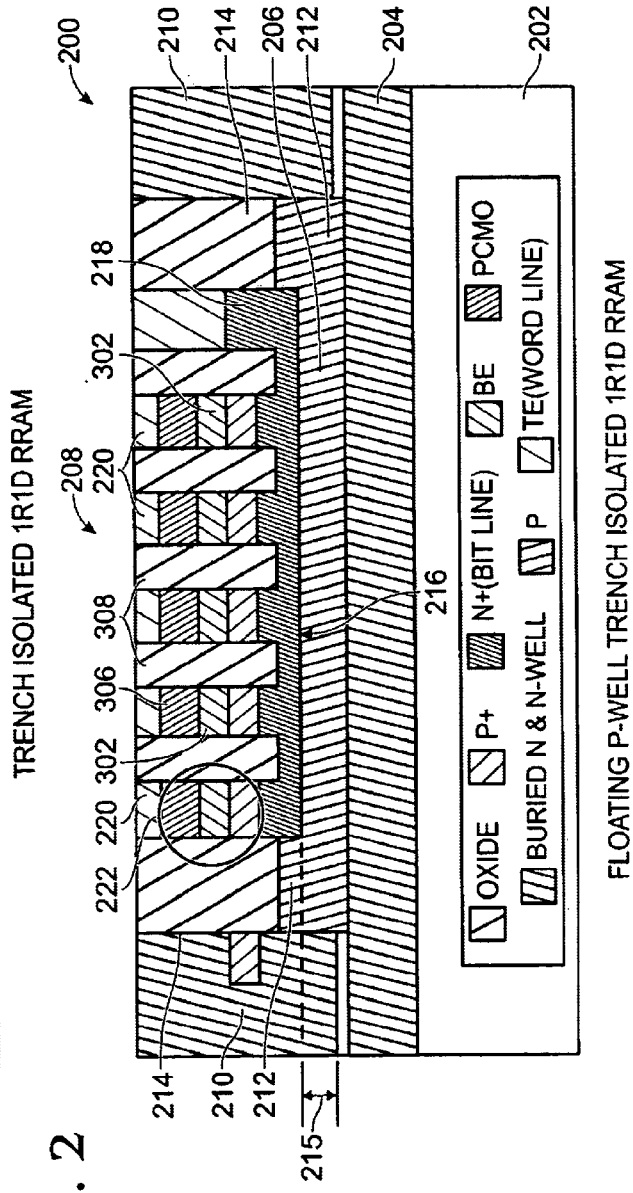
FIG. 2 is a partial cross-sectional view of the present invention one-resistor/one-diode (1R1D) R-RAM with a floating p-well.

FIG. 2 is a partial cross-sectional view of the present invention one-resistor/one-diode (1R1) R-RAM with a floating p-well. The R-RAM 200 comprises an integrated circuit (IC) substrate 202 and an n-doped buried layer of silicon 204 (buried n layer) overlying the substrate 202. A p-doped well of silicon 206 (p-well) overlies the buried n layer 204. A 1R1D R-RAM array 208 is overlying and inside the p-well 206.

In some aspects of the R-RAM 200, n-doped silicon sidewalls 210 overlie the buried n layer 204. The combination of the n-doped silicon sidewalls 210 and the buried n layer 204 forms an n-well. Therefore, it can be stated that the p-well 206 is formed inside the n-well 204/210, where the n-well is the combination of elements 204 and 210.

Typically, the p-well 206 has sidewalls 212, with an oxide insulator 214 overlying the p-well sidewalls 212. The oxide insulator 214 is located between the n-well 204/210 and the R-RAM array 208. More specifically, the oxide insulator 214 is interposed between the R-RAM array 208 and the n-doped sidewalls 210. The p-well 206 of silicon has a thickness 215 in the range of 0.2 to 0.8 microns.

The p-well 206 has a top surface 216 and the 1R1D R-RAM array 208 includes a bit lines 218 overlying the p-well top surface 216. Although only a single bit line 218 is shown in this cross-section, the 1R1D array 208 is not limited to any particular number of bit lines. The 1R1D array 208 comprises b word lines 220 overlying and orthogonal to the bit lines 218. Although five word lines 220 are shown, the R-RAM 200 is not limited to any particular number of word lines. The 1R1D array 208 further comprises (b×a) one-resistor/one-diode (1R1) elements 222 interposed between each bit line 218 and each overlying word line 220.

Figure 3:
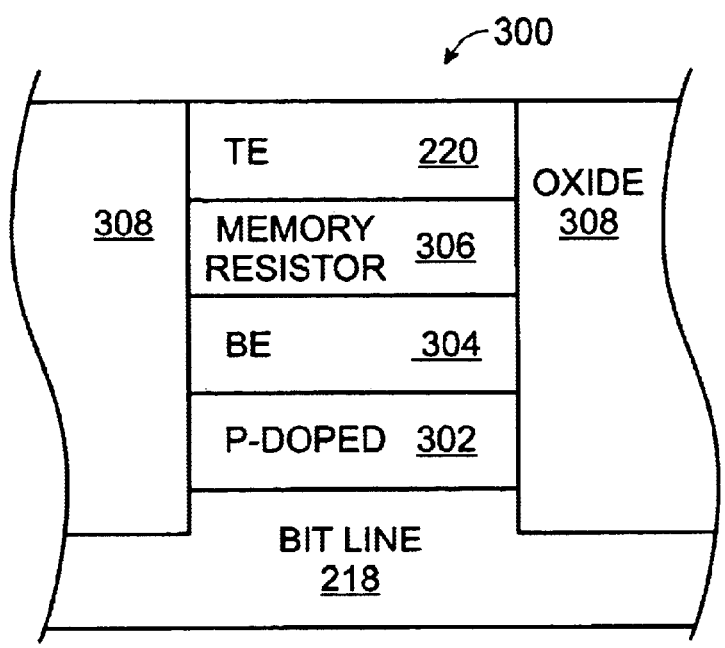
FIG. 3 is a detailed depiction, from FIG. 2, of a word line trench.

FIG. 3 is a detailed depiction, from FIG. 2, of a word line trench 300. The 1R1D array includes b oxide insulated word line trenches overlying and orthogonal to the bit lines. Each word line trench 300 includes a layer of p-doped silicon 302 overlying the bit lines 218, a layer of bottom electrode 304 (BE) overlying the p-doped layer 302, and a layer of memory resistor material 306 overlying the bottom electrode 304. The bottom electrode 304 is typically made from a material such as Pt, Ir, or Pt/TiN/Ti, although other materials can also be used. The b word lines 220 overlie the memory resistor layers 306. The memory resistor material 306 can be $Pr_{0.3}Ca_{0.7}MnO_3$ (PCMO), colossal magnetoresistance (CMR), or a high temperature superconductivity (HTSC) material. Again, it is also possible to use other memory resistor materials. Oxide isolation regions 308 separate the word line trenches 300.

Returning to FIG. 2, the p-well 206 is doped with a doping density in the range between $1 \times 10^{15}/cm^3$ and $1 \times 10^{17}/cm^3$. The n-well 204/210 is doped with either phosphorous, at an energy of 500 KeV to 2 MeV, or arsenic, at an energy of 1 MeV to 5 MeV. The doping density is in the range between $1 \times 10^{16}/cm^3$ and $1 \times 10^{17}/cm^3$. Typically, the n-well 204/210 is doped after the deposition of the p-well silicon 206. Less typically, the n-well 204/210 can be formed from an n-doped substrate 202. However, ICs are usually fabricated on p-doped substrates.

In one aspect of the R-RAM 200, the a bit lines 218 are n-doped silicon and the b word lines 220 are a top electrode (TE). Alternately but not shown, the word lines can be formed directly overlying the p-well of n-doped silicon and the bit lines can be the top electrodes.

FUNCTIONAL DESCRIPTION

The present invention floating p-well trench isolated 1R1D R-RAM is formed in a process that fabricates an n+ bit line onto a p-substrate. The doping density of the floating p-well is preferably in the order of $10^{15}$ to $10^{17}/cm^3$, while the doping density of the buried n-layer is in the order of $10^{16}$ to $10^{17}/cm^3$. In this manner, the n/p junction space charge region can be made very wide. That is, the junction capacitance at the n/p junction is small. The parasitic capacitance of the n+ bit line is total capacitance of series connected elements including of the n+ bit line, the p-well, the buried n layer, and the substrate. This parasitic capacitance is significantly smaller, less than half the capacitance of convention R-RAM n+ bit lines, which do not have the advantage of a floating p-well.

Figure 4:
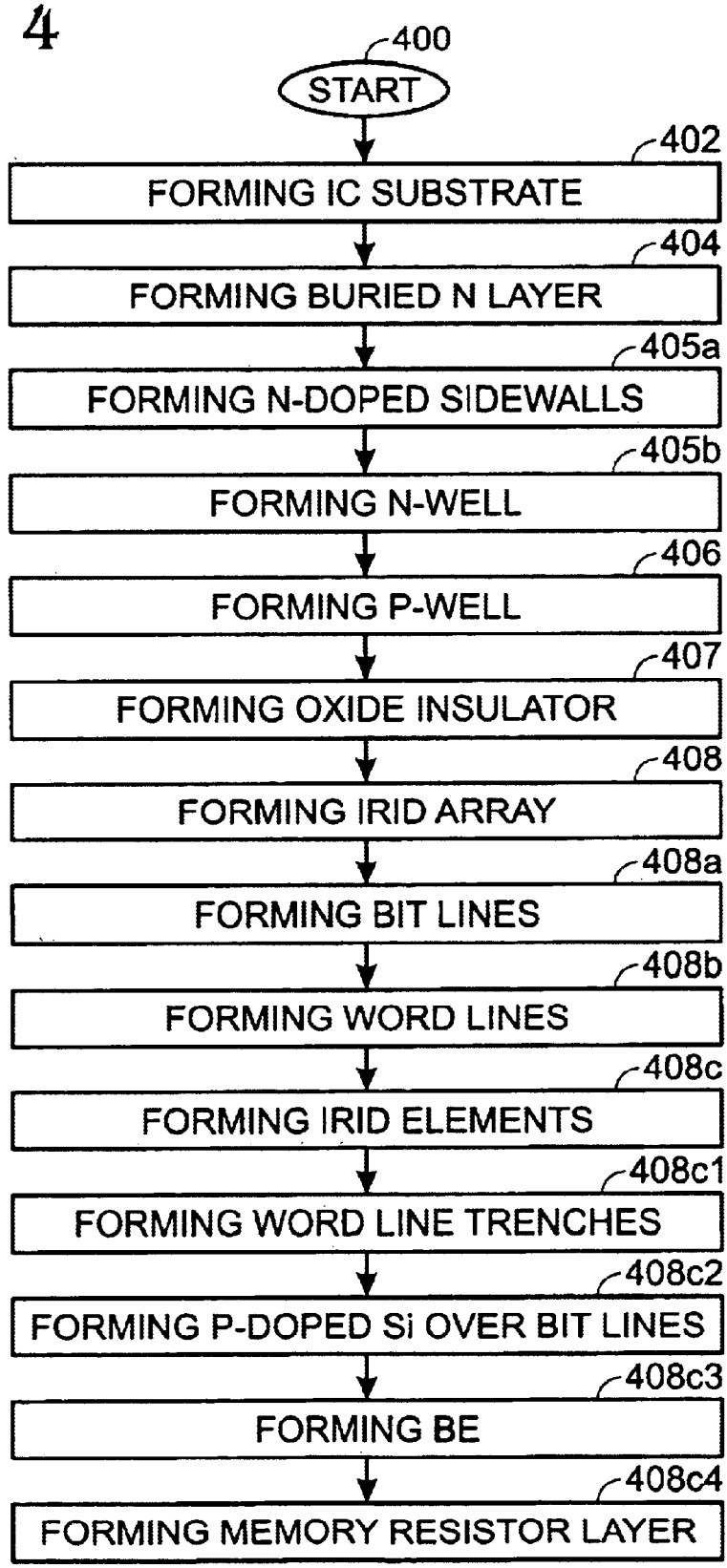
FIG. 4 is a flowchart illustrating the present invention method for fabricating a one-resistor/one-diode (1R1) R-RAM array with a floating p-well.

FIG. 4 is a flowchart illustrating the present invention method for fabricating a one-resistor/one-diode (1R1) R-RAM array with a floating p-well. Although the method (and the method below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 400.

Step 402 forms an integrated circuit (IC) substrate. Step 404 forms an n-doped buried layer of silicon (buried n layer) overlying the substrate. Step 406 forms a p-doped well of silicon (p-well) overlying the buried n layer. Step 408 forms a 1R1D R-RAM array overlying the p-well.

Some aspects of the method include additional steps. Step 405a forms n-doped silicon sidewalls overlying the buried n layer. Step 405b forms an n-doped well (n-well) of silicon from the combination of n-doped silicon sidewalls and the buried n layer. Then, forming a p-doped well of silicon (p-well) overlying the buried n layer in Step 406 includes forming the p-well inside the n-well.

In other aspects, forming a p-well in Step 406 includes forming a p-well with sidewalls. Then, the method may comprise a further step, Step 407, of forming an oxide insulator overlying the p-well sidewalls, between the n-well and the R-RAM array.

In some aspects, forming a p-well in Step 406 includes forming a p-well with a top surface, and forming a 1R1D R-RAM array overlying the p-well in Step 408 includes sub steps. Step 408a forms a bit lines overlying the p-well top surface. Step 408b forms b word lines overlying and orthogonal to the bit lines. Step 408c forms (b×a) one-resistor/one-diode (1R1D) elements interposed between each bit line and each overlying word line.

In some aspects, forming (b×a) one-resistor/one-diode (1R1D) elements interposed between each bit line and each overlying word line is Step 408c includes sub steps. Step 408c1 forms b oxide insulated word line trenches overlying and orthogonal to the bit lines. Step 408c2, in each trench, forms a layer of p-doped silicon overlying the bit lines. Step 408c3 forms a layer of bottom electrode (BE) overlying the p-doped layer. The bottom electrode can be a material such as Pt, Ir, or Pt/TiN/Ti. Step 408c4 forms a layer of memory resistor material overlying the bottom electrode. The memory resistor material can be $Pr_{0.3}Ca_{0.7}MnO_3$ (PCMO), colossal magnetoresistance (CMR), or high temperature superconductivity (HTSC) materials. Then, forming b word lines overlying and orthogonal to the bit lines in Step 408b includes forming the word lines overlying the memory resistor layers.

In some aspects, forming a p-doped well of silicon (p-well) in Step 406 includes doping the p-well with a doping density in the range between $1 \times 10^{15}/cm^3$ and $1 \times 10^{17}/cm^3$. Step 406 may also include forming the p-well with a thickness in the range of 0.2 to 0.8 microns. In other aspects, forming an n-doped buried layer of silicon (n layer) overlying the substrate in Step 404 includes doping the n-well using phosphorous, at an energy of 500 KeV to 2 MeV, or arsenic, at an energy of 1 MeV to 5 MeV. The doping density is in the range between $1 \times 10^{16}/cm^3$ and $1 \times 10^{17}/cm^3$. Other donor materials could also be used in different aspects of the method.

In some aspects, forming a bit lines overlying the p-well top surface in Step 408a includes forming a bit lines of n-doped silicon overlying the p-well top surface. Forming b word lines overlying and orthogonal to the bit lines in Step 408b includes forming word lines of top electrode (TE).

Figure 5:
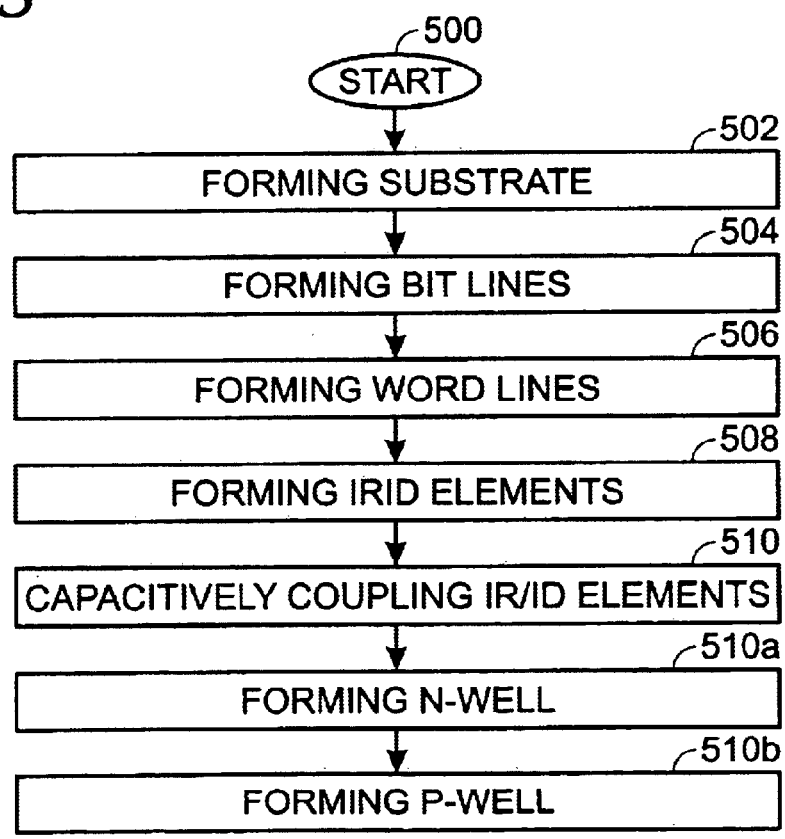
FIG. 5 is a flowchart illustrating the present invention method for forming a one-resistor/one-diode (1R1) R-RAM with reduced bit line capacitance.

FIG. 5 is a flowchart illustrating the present invention method for forming a one-resistor/one-diode (1R1) R-RAM with reduced bit line capacitance. The method starts at Step 500. Step 502 forms a substrate. Step 504 forms a bit lines overlying the substrate. Step 506 forming b word lines overlying and orthogonal to the bit lines. Step 508 forms (b×a) one-resistor/one-diode (1R1) elements interposed between the word lines and each overlying bit line. Step 510 capacitively couples each 1R1D element to the substrate through a p-doped well of silicon (P-well) in series with an n-doped well (n-well) of silicon.

In some aspects, capacitively coupling each 1R1D element to the substrate through a p-doped well of silicon (p-well) in series with an n-doped well (n-well) of silicon in Step 510 includes sub steps. Step 510a forms the n-well overlying the substrate. Step 510b forms the p-well, with a top surface, inside the n-well. Then, forming a bit lines overlying the substrate in Step 504 includes forming the bit lines overlying the p-well top surface.

A low-capacitance 1R1D R-RAM array and fabrication method have been provided. Many conventional process steps and materials have been presented to illustrate the invention, and it should be understood that the invention is not limited to any of these specific examples. The invention has also primarily been presented with the implication that the bit lines are formed from n-doped silicon, but it should be understood that the relative positions of the bit and word lines can be exchanged. Likewise, it should be understood that the concepts of the present invention apply to a wider class of array structures than just the 1R1D structures present above. Additional variations and embodiments of the invention will occur to those skilled in the art.

We claim:

1. A method for fabricating a one-resistor/one-diode (1R1D) R-RAM array with a floating p-well, the method comprising:

forming an integrated circuit (IC) substrate;

forming an n-doped buried layer of silicon (buried n layer) overlying the substrate;

forming a p-doped well of silicon (p-well) overlying the buried n layer; and, forming a 1R1D R-RAM array overlying the p-well.

2. The method of claim 1 further comprising:

forming n-doped silicon sidewalls overlying the buried n layer;

forming an n-doped well (n-well) of silicon from the combination of n-doped silicon sidewalls and the buried n layer; and, wherein forming a p-doped well of silicon (p-well) overlying the buried n layer includes forming the p-well inside th n-well.

3. The method of claim 2 wherein forming a p-well includes forming a p-well with sidewalk; and, the method further comprising:

forming an oxide insulator overlying the p-well sidewalk, between the n-well and the R-RAM array.

4. The method of claim 3 wherein forming a p-well includes forming a p-well with a top surface; and, wherein forming a 1R1D R-RAM array overlying the p-well includes:

forming a bit lines overlying the p-well top surface;

forming b word lines overlying and orthogonal to the bit lines; and, forming (b×a) one-resistor/one-diode (1R1) elements interposed between each bit line and each overlying word line.

5. The method of claim 4 wherein forming (b ×a) one-resistor/one-diode(1R1) elements interposed between each bit line and each overlying word line includes:

forming b, oxide insulated word line trenches overlying and orthogonal to the bit lines;

in each trench forming a layer of p-doped silicon overlying the bit lines;

forming a layer of bottom electrode (BE) overlying the p-doped layer; and, forming a layer of memory resistor material overlying the bottom electrode; and, wherein forming b word lines overlying and orthogonal to the bit lines includes forming the word lines overlying the memory resistor layers.

6. The method of claim 5 wherein forming a p-doped well of silicon (p-well) includes doping the p-well with a doping density in the range between $1 \times 10^{15}/cm^3$ and $1 \times 10^{17}/cm^3$.

7. The method of claim 5 wherein forming an n-doped buried layer of silicon (n layer) overlying the substrate includes doping the n-well using a material selected from the group including phosphorous, at an energy of 500 KeV to 2 MeV, and arsenic, at an energy of 1 MeV to 5 MeV, with a doping density in the range between $1 \times 10^{16}/cm^3$ and $1 \times 10^{17}/cm^3$.

8. The method of claim 5 wherein forming a bit lines overlying the p-well top surface includes forming a bit lines of n-doped silicon overlying the p-well top surface.

9. The method of claim 5 wherein forming b word lines overlying and orthogonal to the bit lines includes forming word lines of top electrode (TE).

10. The method of claim 5 wherein forming a layer of memory resistor material overlying the bottom electrode includes using a memory resistor material selected from the group including $Pr_{0.3}Ca_{0.7}MnO_3$ (PCMO), colossal magnetoresistance (CMR), and high temperature superconductivity (HTSC) materials.

11. The method of claim 5 wherein forming a layer of bottom electrode overlying the p-doped layer includes forming the bottom electrode from a material selected from the group including Pt, Ir, and Pt/TiN/Ti.

12. The method of claim 1 wherein forming a p-doped well of silicon (p-well) overlying the buried n layer includes forming a p-well with a thickness in the range of 0.2 to 0.8 microns.

13. A one-resistor/one-diode (1R1) R-RAM with a floating p-well, the R-RAM comprising:

an integrated circuit (IC) substrate;

an n-doped buried layer of silicon (buried n layer) overlying the substrate;

a p-doped well of silicon (p-well) overlying the buried n layer; and, a 1R1D R-RAM array overlying and inside the p-well.

14. The R-RAM array of claim 13 further comprising:

n-doped silicon sidewalls overlying the buried n layer, wherein the combination of the n-doped silicon sidewalls and the buried n layer forms an n-well; and, wherein the p-well is formed inside the n-well.

15. The R-RAM array of claim 14 wherein the p-well has sidewalls; and, the R-RAM further comprising:

an oxide insulator overlying the p-well sidewalls, between the n-well and the R-RAM array.

16. The R-RAM array of claim 15 wherein the p-well has a top surface; and, wherein the 1R1D R-RAM array includes:

a bit lines overlying the p-well top surface;
b word lines overlying and orthogonal to the bit lines; and,
(b×a) one-resistor/one-diode (1R) elements interposed between each bit line and each overlying word line.

17. The R-RAM array of claim 16 further comprising:
b oxide insulated word line trenches overlying and orthogonal to the bit lines;
wherein the 1R1D elements includes:
in each word line trench, a layer of p-doped silicon overlying the bit lines;
a layer of bottom electrode (BE) overlying the p-doped layer; and,
a layer of memory resistor material overlying the bottom; and,
wherein the b word lines overlie the memory resistor layers.

18. The R-RAM array of claim 17 wherein the p-well is doped with a doping density in the range between $1\times10^{15}/cm^3$ and $1\times10^{17}/cm^3$.

19. The R-RAM array of claim 17 wherein the n-well is doped with a material selected from the group including phosphorous, at an energy of 500 KeV to 2 MeV, and arsenic, at an energy of 1 MeV to 5 MeV, with a doping density in the range between $1\times10^{16}/cm^3$ and $1\times10^{17}/cm^3$.

20. The R-RAM array of claim 17 wherein the a bit lines are n-doped silicon.

21. The R-RAM array of claim 17 wherein the b word lines are top electrodes.

22. The R-RAM of claim 17 wherein the memory resistor material is selected from the group including $Pr_{0.3}Ca_{0.7}MnO_3$ (PCMO), colossal magnetoresistance (CMR), and high temperature superconductivity (HTSC) materials.

23. The R-RAM of claim 17 wherein the bottom electrode is a material selected from the group including Pt, Ir, and Pt/TiN/Ti.

24. The R-RAM of claim 13 wherein the p-doped well of silicon has a thickness in the range of 0.2 to 0.8 microns.

25. A method for fabricating a one-resistor/one-diode (1R1D) R-RAM array with a floating p-well, the method comprising
forming an integrated circuit (IC) substrate;
forming an n-doped buried layer of silicon (buried n layer) overlying the substrate;
forming n-doped silicon sidewalls overlying the buried n layer;
forming an n-doped well (n-well) of silicon from the combination of n-doped silicon sidewalls and the buried n layer;
forming a p-doped well of silicon (p-well), with sidewalls and a top surface, overlying the buried n layer, inside the n-well;
forming an oxide insulator overlying the p-well sidewalls; and,
forming a 1R1D R-RAM array overlying the p-well as follows;
forming a bit lines overlying the p-well top surface;
forming b word lines overlying and orthogonal to the bit lines; and,
forming (b×a) one-resistor/one-diode (1R1D) elements interposed between each bit line and each overlying word line.

26. A one-resistor/one-diode (1R) R-RAM with a floating p-well, the R-RAM comprising:
an integrated circuit (IC) substrate;
an n-doped buried layer of silicon (buried n layer) overlying the substrate;
n-doped silicon sidewalls overlying the buried n layer, wherein the combination of the n-doped silicon sidewalls and the buried n layer forms an n-well;
a p-doped well of silicon (p-well), with sidewalls and a top surface, overlying the buried n layer, inside the n-well;
an oxide insulator overlying the p-well sidewalls; and,
a 1R1D R-RAM array overlying and inside the p-well, wherein the 1R1D R-RAM array includes:
a bit lines overlying the p-well top surface;
b word lines overlying and orthogonal to the bit lines; and,
(b×a) one-resistor/one-diode (1R) elements interposed between each bit line and each overlying word line.

* * * * *

UNITED STATES PATENT AND TRADEMARK OFFICE
CERTIFICATE OF CORRECTION

PATENT NO. : 6,849,564 B2
APPLICATION NO. : 10/376796
DATED : February 1, 2005
INVENTOR(S) : Hsu et al.

It is certified that error appears in the above-identified patent and that said Letters Patent is hereby corrected as shown below:

On the Face Page, in Column 1, delete "(30)    Foreign Application Priority Data
                                                Mar. 7, 2002   (DE) ..............................102 10 180".

In Fig. 5, Sheet 2 of 3, for Tag "508", in Line 1, delete "IRID" and insert -- 1R1D --, therefor.

In Fig. 5, Sheet 2 of 3, for Tag "510", in Line 1, delete "IR/ID" and insert -- 1R1D --, therefor.

In Fig. 4, Sheet 3 of 3, for Tag "408", in Line 1, delete "IRID" and insert -- 1R1D --, therefor.

In Fig. 4, Sheet 3 of 3, for Tag "408c", in Line 1, delete "IRID" and insert -- 1R1D --, therefor.

In Column 2, Line 46, delete "(1R1)" and insert -- (1R1D) --, and therefor at each occurrence throughout the whole patent.

In Column 4, Lines 26-27, delete "sub steps." and insert -- substeps. --, therefor.

In Column 4, Line 35, delete "sub steps." and insert -- substeps. --, therefor.

In Column 5, Line 8, delete "(P-well)" and insert -- (p-well) --, therefor.

In Column 5, Line 13, delete "sub steps." and insert -- substeps. --, therefor.

In Column 5, Line 51, in Claim 2, delete "th" and insert -- the --, therefor.

In Column 5, Line 53, in Claim 3, delete "sidewalk;" and insert -- sidewalls; --, therefor.

In Column 5, Line 55, in Claim 3, delete "sidewalk," and insert -- sidewalls, --, therefor.

In Column 6, Line 1, in Claim 5, delete "(b xa)" and insert -- (bxa) --, therefor.

Signed and Sealed this
Second Day of April, 2013

Teresa Stanek Rea
*Acting Director of the United States Patent and Trademark Office*

CERTIFICATE OF CORRECTION (continued)
U.S. Pat. No. 6,849,564 B2

In Column 6, Line 4, in Claim 5, delete "b," and insert -- b --, therefor.

In Column 7, Line 44, in Claim 25, delete "comprising" and insert -- comprising: --, therefor.

In Column 8, Line 16, in Claim 25, delete "follows;" and insert -- follows: --, therefor.